United States Patent
Mueller et al.

(10) Patent No.: US 11,687,008 B2
(45) Date of Patent: Jun. 27, 2023

(54) METHOD FOR AUTOMATED CRITICAL DIMENSION MEASUREMENT ON A SUBSTRATE FOR DISPLAY MANUFACTURING, METHOD OF INSPECTING A LARGE AREA SUBSTRATE FOR DISPLAY MANUFACTURING, APPARATUS FOR INSPECTING A LARGE AREA SUBSTRATE FOR DISPLAY MANUFACTURING AND METHOD OF OPERATING THEREOF

(71) Applicant: Applied Materials, Inc., Santa Clara, CA (US)

(72) Inventors: Bernhard G. Mueller, Finsing (DE); Robert Trauner, Pliening (DE); Bernhard Schüler, Munich (DE); Peter C. Staffansson, Feldkirchen (DE); Kulpreet Singh Virdi, Munich (DE); Volker Daiker, Feldkirchen (DE)

(73) Assignee: APPLIED MATERIALS, INC., Santa Clara, CA (US)

( * ) Notice: Subject to any disclaimer, the term of this patent is extended or adjusted under 35 U.S.C. 154(b) by 15 days.

(21) Appl. No.: 16/319,163

(22) PCT Filed: Feb. 22, 2018

(86) PCT No.: PCT/EP2018/054411
§ 371 (c)(1),
(2) Date: Jan. 18, 2019

(87) PCT Pub. No.: WO2019/161899
PCT Pub. Date: Aug. 29, 2019

(65) Prior Publication Data
US 2021/0373444 A1 Dec. 2, 2021

(51) Int. Cl.
*G03F 7/20* (2006.01)
*G03F 7/00* (2006.01)

(52) U.S. Cl.
CPC ................... *G03F 7/70625* (2013.01)

(58) Field of Classification Search
CPC ..................................... G03F 7/70625
See application file for complete search history.

(56) References Cited

U.S. PATENT DOCUMENTS 6,476,388 B1 * 11/2002 Nakagaki ............. G01N 23/225
250/306
2004/0022429 A1 * 2/2004 Suzuki .................... G06T 7/001
382/145
(Continued)

FOREIGN PATENT DOCUMENTS

CN 1254943 A 5/2000
CN 1264850 A 8/2000
(Continued)

OTHER PUBLICATIONS

Japanese Office Action, Application No. JP 2019-529149, dated Jun. 2, 2020.
(Continued)

*Primary Examiner* — Steven Whitesell Gordon
(74) *Attorney, Agent, or Firm* — Patterson + Sheridan, LLP

(57) ABSTRACT

According to an embodiment, a method for automated critical dimension measurement on a substrate for display manufacturing is provided. The method includes scanning a first field of view having a first size with a charged particle beam to obtain a first image having a first resolution of a first portion of the substrate for display manufacturing; determining a pattern within the first image, the pattern having a first position; scanning a second field of view with the charged particle beam to obtain a second image of a second
(Continued)

portion of the substrate, the second field of view has a second size smaller than the first size and has a second position provided relative to the first position, the second image has a second resolution higher than the first resolution; and determining a critical dimension of a structure provided on the substrate from the second image.

18 Claims, 9 Drawing Sheets

(56) References Cited

U.S. PATENT DOCUMENTS

| | | | | |
|---|---|---|---|---|
| 2006/0219906 | A1* | 10/2006 | Langer | H01L 22/12 |
| | | | | 250/307 |
| 2007/0164219 | A1* | 7/2007 | Shishido | H01J 37/263 |
| | | | | 250/310 |
| 2010/0280812 | A1* | 11/2010 | Zhang | G03F 7/705 |
| | | | | 703/13 |
| 2011/0133080 | A1* | 6/2011 | Shishido | H01J 37/263 |
| | | | | 250/307 |
| 2014/0226003 | A1* | 8/2014 | Phaneuf | H01J 37/3005 |
| | | | | 348/80 |
| 2019/0006147 | A1* | 1/2019 | Kastrup | H01J 37/023 |

FOREIGN PATENT DOCUMENTS

| | | |
|---|---|---|
| JP | 2017-084537 A | 5/2017 |
| JP | 2017-535787 A | 11/2017 |
| WO | 2016/101978 A1 | 6/2016 |
| WO | 2017/084537 A1 | 5/2017 |

OTHER PUBLICATIONS

Korean Office Action dated May 25, 2020 for Application No. 10-2019-7002941.
International Search Report and Written Opinion dated Dec. 5, 2018 for Application No. PCT/EP2018/054411.
Elizabeth E. Chain et al.; "Automated CD measurements with the Hitachi S-6280"; SPIE Digital Library; May 22, 1995.

* cited by examiner

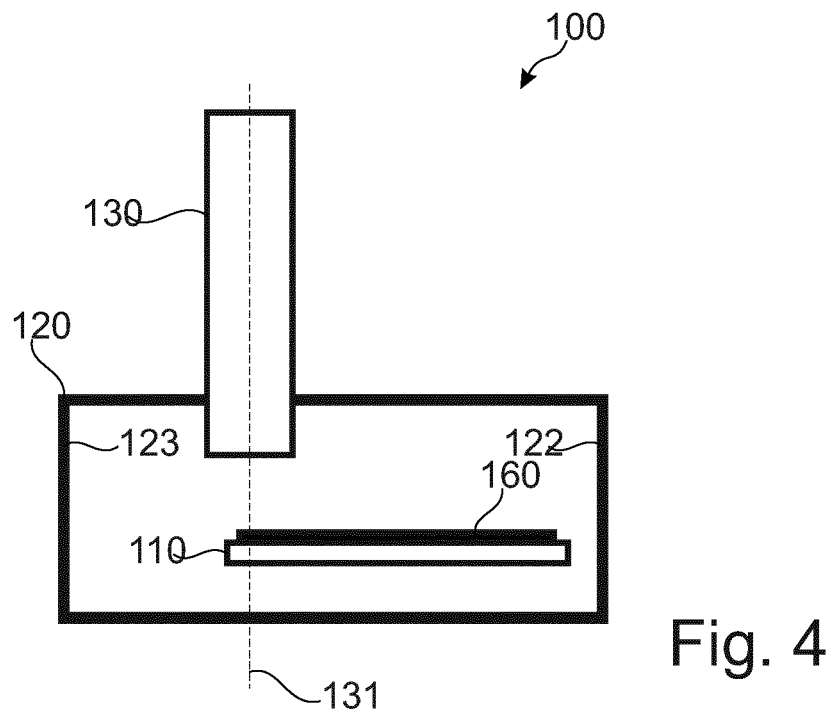
Fig. 4
Fig. 5
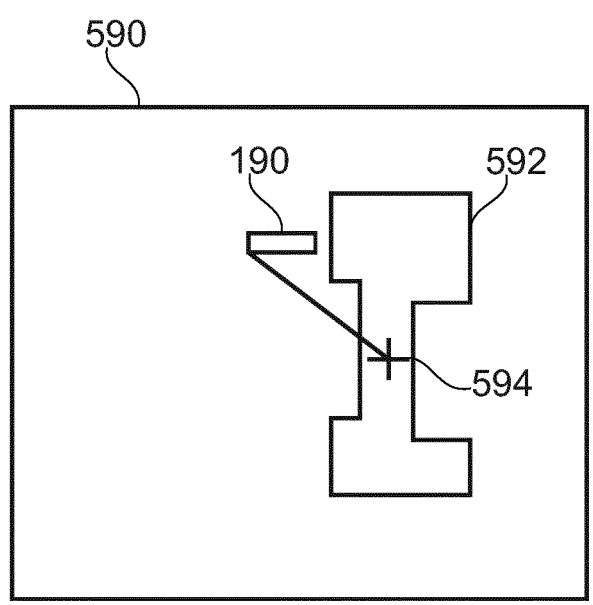

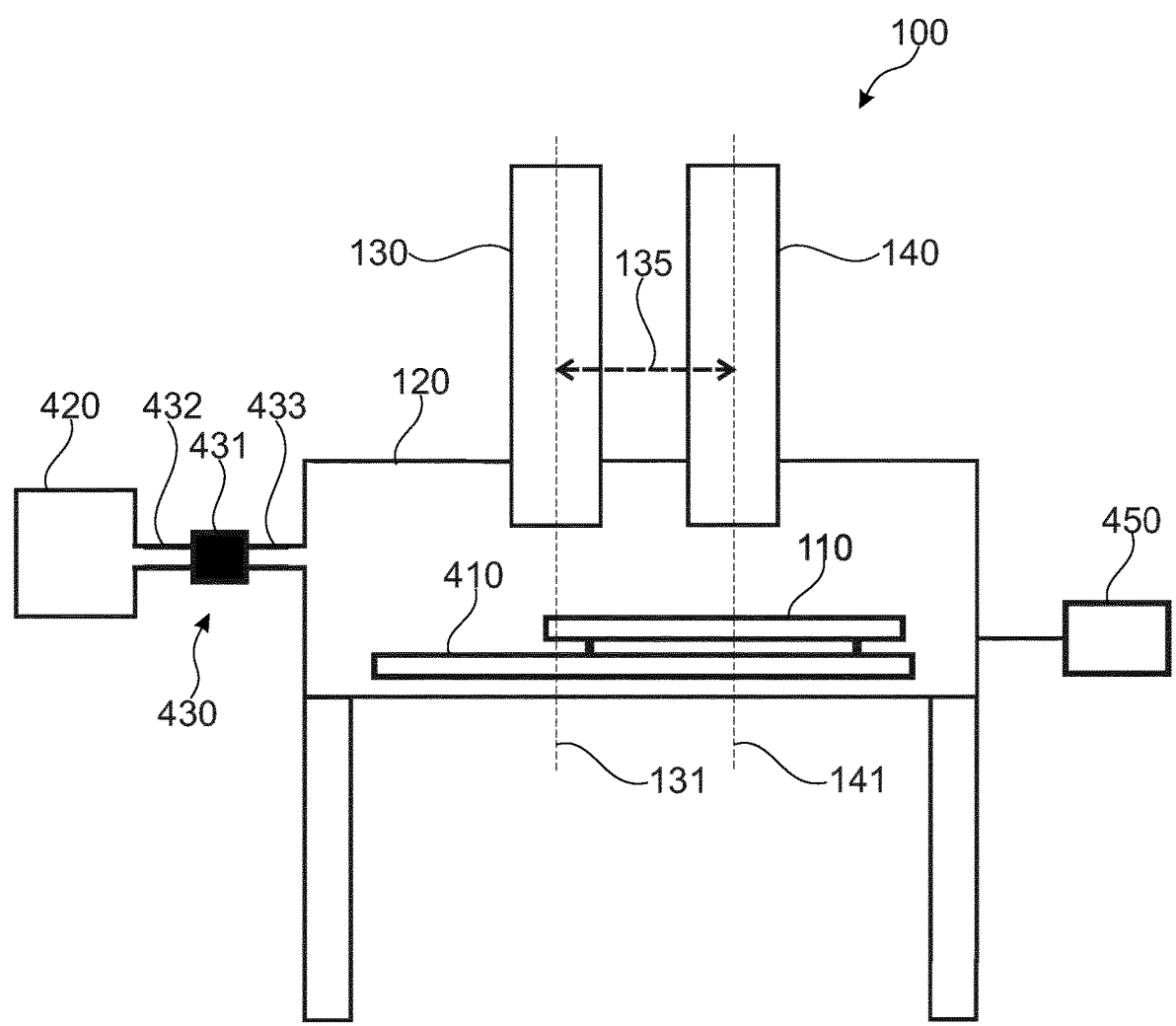
Fig. 7
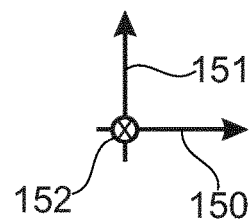

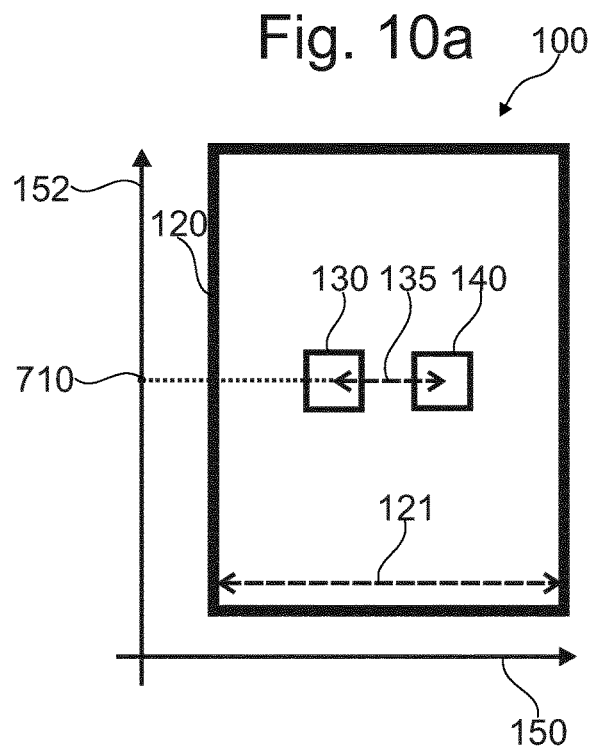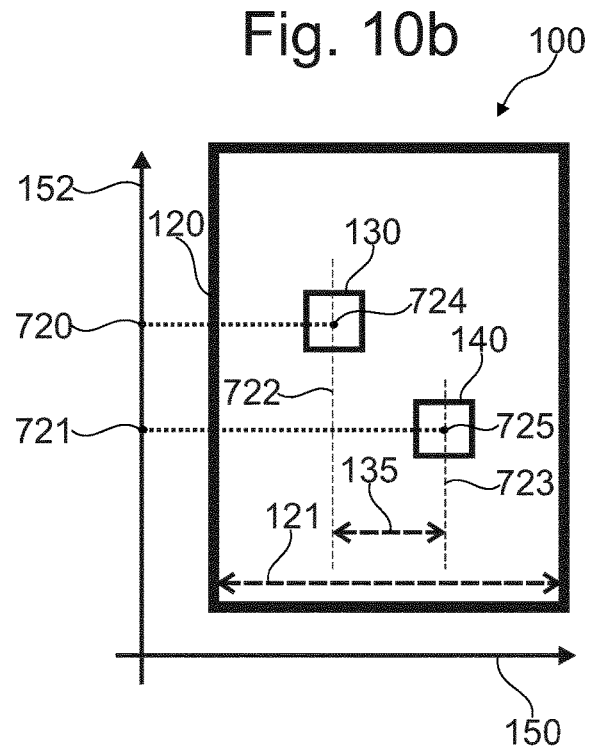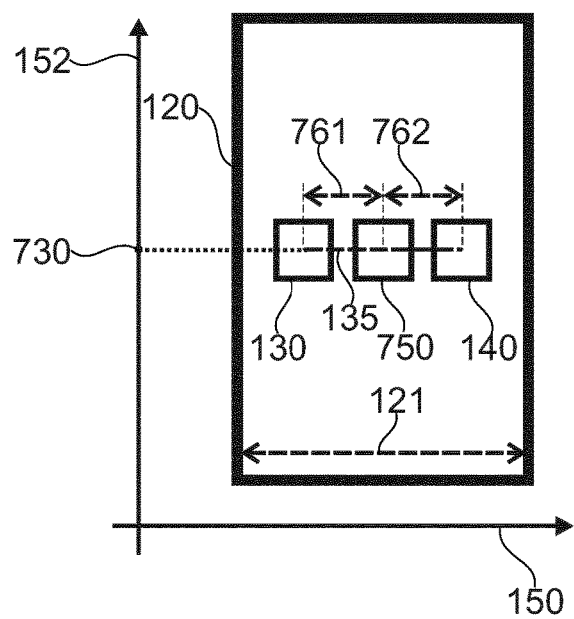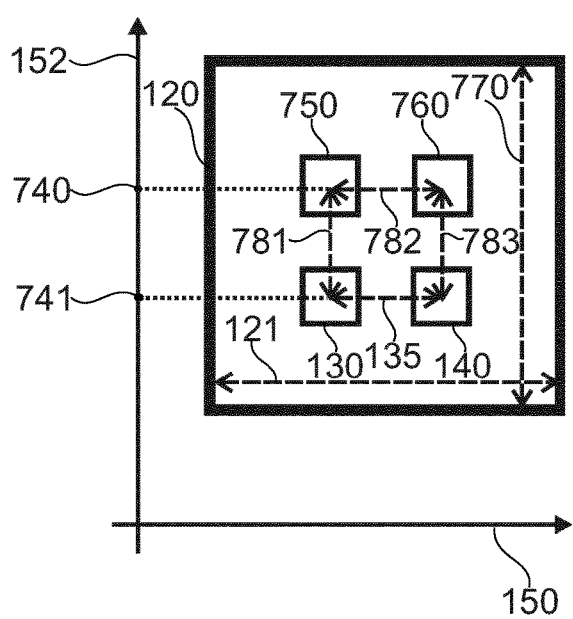

METHOD FOR AUTOMATED CRITICAL DIMENSION MEASUREMENT ON A SUBSTRATE FOR DISPLAY MANUFACTURING, METHOD OF INSPECTING A LARGE AREA SUBSTRATE FOR DISPLAY MANUFACTURING, APPARATUS FOR INSPECTING A LARGE AREA SUBSTRATE FOR DISPLAY MANUFACTURING AND METHOD OF OPERATING THEREOF

FIELD

The present disclosure relates to an apparatus and a method for inspecting a substrate. More particularly, embodiments described herein relate a method for automated critical dimension (CD) measurements on substrates for display manufacturing, such as large area substrates. Particularly, embodiments relate to a method for automated critical dimension measurement on a substrate for display manufacturing, a method of inspecting a large area substrate for display manufacturing, and apparatus for inspecting a large area substrate for display manufacturing, and a method of operating thereof.

BACKGROUND

In many applications, it is necessary to inspect a substrate to monitor the quality of the substrate. For example, glass substrates on which layers of coating material are deposited are manufactured for the display market. Since defects may e.g. occur during the processing of the substrates, e.g. during the coating of the substrates, an inspection of the substrate for reviewing the defects and for monitoring the quality of the displays is necessary. Additionally, the size, shape and relative location of structures created by any patterning process step needs to be monitored and controlled by SEM review, for example the measurement of critical dimensions (CD).

Displays are often manufactured on large area substrates with continuously growing substrate sizes. Further, displays, such as TFT-displays, are subject to continuous improvement. The inspection of the substrate can be carried out by an optical system. However, critical dimension (CD) measurements, for example, of structures of a TFT-array, require a resolution that cannot be provided with optical inspection. A CD measurement can for example provide the size of the structure or distances between structures in a range of some ten nanometers. The resulting dimension can be compared to a desired dimension, wherein the dimension can be considered critical for evaluating the properties of the manufacturing process.

CD measurements can be provided, for example in the semiconductor industry, in which wafers are inspected, by a manual process. For example, a light microscope can be utilized to identify an area of interest on the wafer. Further, the area of interest can be further defined by manually increasing the magnification and a final CD measurement that may be conducted with a scanning electron microscope can be provided. According to another example, a high resolution image of the wafer can be scanned and a critical dimension can be extracted from the high resolution image of the wafer.

Substrates for display manufacturing are typically glass substrates having an area of, for example, 1 m$^2$ or above. High resolution images on such large substrates are very challenging per se, and most findings from the wafer industry are not applicable. Further, the options for CD measurement, which are exemplarily described above, are not suitable for large area substrates since, for example, the resulting throughput would be undesirable.

Accordingly, given e.g. the increasing demands on the quality of displays on large area substrates, there is a need for an improved apparatus and method for inspecting large area substrates, for example, without braking the substrates to smaller samples and allowing to continue the manufacturing process of the substrates after the inspection or CD measurement.

SUMMARY

In light of the above, a method for automated critical dimension measurement on a substrate for display manufacturing, a method of inspecting a large area substrate for display manufacturing, an apparatus for inspecting a large area substrate for display manufacturing, and a method of operating thereof are provided. Further aspects, advantages and features of the present disclosure are apparent from the description and the accompanying drawings.

According to an embodiment, a method for automated critical dimension measurement on a substrate for display manufacturing is provided. The method includes scanning a first field of view having a first size with a charged particle beam to obtain a first image having a first resolution of a first portion of the substrate for display manufacturing; determining a pattern within the first image, the pattern having a first position; scanning a second field of view with the charged particle beam to obtain a second image of a second portion of the substrate, the second field of view has a second size smaller than the first size and has a second position provided relative to the first position, the second image has a second resolution higher than the first resolution; and determining a critical dimension of a structure provided on the substrate from the second image.

According to a further embodiment, a method of inspecting a large area substrate for display manufacturing is provided. The method includes (a) imaging a first portion of the substrate in a first area having a first type of structure to obtain a first image; (b) determining a pattern within the first portion; (c) imaging a second portion of the substrate in the first area to obtain a second image having a higher resolution than the first image; (d) determining a critical dimension of the first type of structure in the first area; and repeating (a) to (c) in a plurality of areas on the large area substrate, the plurality of areas being distributed over at least 1.2 m$^2$ on the large area substrate.

According to a further embodiment, an apparatus for inspecting a large area substrate for display manufacturing is provided. The method includes a vacuum chamber; a substrate support arranged in the vacuum chamber, wherein the substrate support provides a substrate receiving area of at least 1.2 m$^2$ and having a first receiving area dimension along a first direction; a first imaging charged particle beam microscope and a second imaging charged particle beam microscope having a distance along the first direction of 30% to 70% of the first receiving area dimension; and a controller comprising: a processor and a memory storing instructions that, when executed by the processor, cause the apparatus to perform a method according embodiments of the present disclosure.

According to a further embodiment, a method of operating an apparatus according to embodiments of the present disclosure is provided. The method includes matching a first coordinate system on the large area substrate of the first imaging charged particle beam microscope with a second coordinate system on the large area substrate of the second imaging charged particle beam microscope.

BRIEF DESCRIPTION OF THE DRAWINGS

A full and enabling disclosure to one of ordinary skill in the art is set forth more particularly in the remainder of the specification including reference to the accompanying drawings wherein:

FIG. 4 shows a side view of another apparatus for inspecting a substrate, according to embodiments described herein;

FIG. 5 shows a schematic view of a large area substrate for display manufacturing for illustrating a method for automated CD measurement;

FIG. 7 shows a side view of an apparatus for inspecting a substrate according to embodiments described herein, wherein the apparatus includes components for reducing vibrations;

FIGS. 10a-d illustrate different arrangements of imaging charged particle beams in a vacuum chamber, according to embodiments described herein.

DETAILED DESCRIPTION

Figure 1:
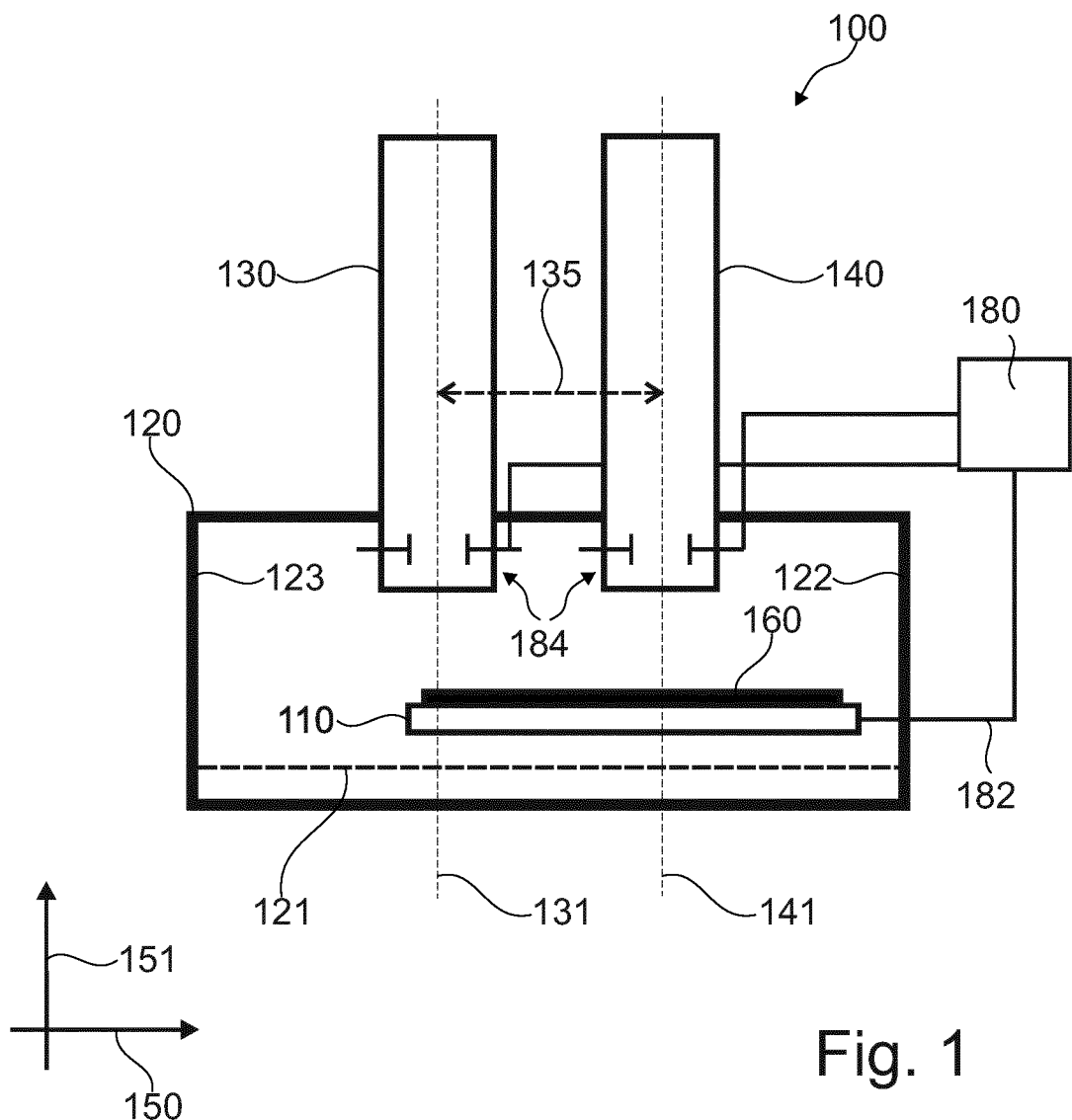
FIG. 1 shows a side view of an apparatus for inspecting a substrate, according to embodiments described herein.

Reference will now be made in detail to the various exemplary embodiments, one or more examples of which are illustrated in each figure. Each example is provided by way of explanation and is not meant as a limitation. For example, features illustrated or described as part of one embodiment can be used on or in conjunction with other embodiments to yield yet further embodiments. The intention is that the present disclosure includes such modifications and variations.

Within the following description of the drawings, the same reference numbers refer to the same components. Only the differences with respect to the individual embodiments are described. The structures shown in the drawings are not necessarily depicted true to scale but rather serve the better understanding of the embodiments.

According to some embodiments, which can be combined with other embodiments described herein, substrates described herein relate to large area substrates, in particular large area substrates for the display market. According to some embodiments, large area substrates or respective substrate supports may have a size of at least 1 $m^2$, such as at least 1.375 $m^2$. The size may be from about 1.375 $m^2$ (1100 mm×1250 mm—Gen 5) to about 9 $m^2$, more specifically from about 2 $m^2$ to about 9 $m^2$ or even up to 12 $m^2$. The substrates or substrate receiving areas, for which the structures, apparatuses, and methods according to embodiments described herein are provided, can be large area substrates as described herein. For instance, a large area substrate or carrier can be GEN 5, which corresponds to about 1.375 $m^2$ substrates (1.1 m×1.25 m), GEN 7.5, which corresponds to about 4.39 $m^2$ substrates (1.95 m×2.25 m), GEN 8.5, which corresponds to about 5.7 $m^2$ substrates (2.2 m×2.5 m), or even GEN 10, which corresponds to about 9 $m^2$ substrates (2.88 m×3130 m). Even larger generations such as GEN 11 and GEN 12 and corresponding substrate areas can similarly be implemented. It has to be considered that the substrate size generations provide fixed industry standards even though a GEN 5 substrate may slightly deviate in size from one display manufacturer to another display manufacturer. Embodiments of an apparatus for testing may for example have a GEN 5 substrate support or GEN 5 substrate receiving area such that GEN 5 substrates of many display manufacturers may be supportable by the support. The same applies to other substrate size generations.

Electron beam review (EBR) for large area substrates, wherein the entire substrate or areas distributed over the entire substrate are measured such that, for example, a display to be manufactured is not destroyed during the review process or for the review process, is a comparably young technology. Resolutions of, for example, 20 nm or below, such as 10 nm or below are very challenging to achieve and previous findings from wafer imaging may not be suitable in light of the significant difference in substrate sizes. For example, a stage, i.e. a substrate table, may be beneficially suitable to position in an arbitrary area of the entire substrate below an electron beam, and the positioning must be very precise over the large area. For large area substrates, the areas to be measured are larger and various areas may be further apart from each other, for example as compared to wafer imaging apparatuses. Accordingly, a simple upscaling cannot be successful, for example, due to the desired throughput. Yet further, processes and apparatuses are beneficially suitable to reduce vibrations on large dimensions below the desired resolution. Yet further, manual or semi-automated processes may also not be suitable in light of the desired throughput as well as the repeatability of measuring positions distributed over the area of the large area substrate.

According to embodiments of the present disclosure, an automated CD measurement on substrates for display manufacturing can be provided. It has surprisingly been found that the balance between accuracy and throughput is possible on large area substrates for CD measurements with a combination of different imaging schemes. According to some embodiments, a lower resolution SEM image is required to find a reference feature on the substrate. The reference feature serves to locate a measurement box at a structure to be measured. The measurement box corresponds to a portion of the substrate including the structure to be measured, i.e. the measurement box can be a field of view for a charged particle beam imaging process. The measurement box or the inner of the measurement box is re-scanned with higher resolution. The CD measurement can be provided at the higher resolution. The lower resolution SEM image can be acquired more quickly as compared to a higher resolution image. The lower resolution SEM image can be utilized to find a reference feature to position a measurement box on a structure to be measured. Accordingly, the tact time and, thus, for example, the throughput can be increased, while a full automation can be provided and while a high-resolution CD measurement can be provided. According to some embodiments, which can be combined with other embodiments described herein, one or more measurement boxes are scanned at a significantly higher resolution.

Processing or testing the entire substrate or areas distributed over the entire substrate, i.e. without breaking the glass, is particularly challenging in view of the large sizes of the substrates which are produced and processed in current display manufacturing technology. Since the sizes of substrates, e.g. large area substrates, are consistently increasing, larger vacuum chambers are utilized for processing or imaging the substrates. However, larger vacuum chambers are more sensitive to unwanted vibrations compared to smaller chambers. The vibration or the vibrations of the vacuum chamber limit the resolution with which the substrates can for example be inspected. In particular, critical dimensions having sizes below the resolution of an inspection system will remain invisible and thus cannot be measured.

FIG. 1 shows a side view of an apparatus for inspecting a substrate, according to embodiments described herein. The apparatus 100 includes a vacuum chamber 120. The apparatus 100 further includes a substrate support 110 on which a substrate 160 may be supported. The apparatus 100 includes a first imaging charged particle beam microscope 130. Further, the apparatus may include a second imaging charged particle beam microscope 140. In the example shown in FIG. 1, the first imaging charged particle beam microscope 130 and the second imaging charged particle beam microscope 140 are arranged above the substrate support 110.

As further shown in FIG. 1, the substrate support 110 extends along the x-direction 150. In the drawing plane of FIG. 1, the x-direction 150 is a left-right direction. A substrate 160 is disposed on the substrate support 110. The substrate support 110 is movable along the x-direction 150 to displace the substrate 160 in the vacuum chamber 120 relative to the first imaging charged particle beam microscope 130 and the second imaging charged particle beam microscope 140. Accordingly, an area of the substrate 160 can be positioned below the first imaging charged particle beam microscope 130 or below the second imaging charged particle beam microscope 140 for CD measurement. The area may include a structure for CD measurement contained in or on a coated layer on the substrate. The substrate support 110 may also be movable along a y-direction (not shown) so that the substrate 160 can be moved along the y-direction, as discussed below. By suitably displacing the substrate support 110 holding the substrate 160 within the vacuum chamber 120, the entire extent of the substrate 160 may be measured inside the vacuum chamber 120.

The first imaging charged particle beam microscope 130 is distanced from the second imaging charged particle beam microscope 140 along the x-direction 150 by a distance 135. In the embodiment illustrated in FIG. 1, the distance 135 is a distance between a center of the first imaging charged particle beam microscope 130 and a center of the second imaging charged particle beam microscope 140. In particular, the distance 135 is a distance, along the x-direction 150, between a first optical axis 131 defined by the first imaging charged particle beam microscope and a second optical axis 141 defined by the second imaging charged particle beam microscope 140. The first optical axis 131 and the second optical axis 141 extend along a z-direction 151. The first optical axis 131 may for example be defined by the objective lens of the first imaging charged particle beam microscope 130. Similarly, the second optical axis 141 may for example be defined by the objective lens of the second imaging charged particle beam microscope 140.

As further shown in FIG. 1, the vacuum chamber 120 has an inner width 121 along the x-direction 150. The inner width 121 may be a distance obtained when traversing the vacuum chamber 120 along the x-direction from left-hand wall 123 of the vacuum chamber 120 to right-hand wall 122 of the vacuum chamber 120. An aspect of the disclosure relates to the dimensions of the apparatus 100 with respect to the e.g. x-direction 150. According to embodiments, the distance 135 along the x-direction 150 between the first imaging charged particle beam microscope 130 and the second imaging charged particle beam microscope 140 may be at least 30 cm, such as at least 40 cm. According to further embodiments, which can be combined with other embodiments described herein, the inner width 121 of the vacuum chamber 120 may lie in the range from 250% to 450% of the distance 135 between the first imaging charged particle beam microscope 130 and the second imaging charged particle beam microscope 140. Further details, aspects, and features are described below with respect to FIGS. 2 and 3.

Embodiments described herein thus may provide an apparatus for inspecting a substrate, in particular a large area substrate, in a vacuum chamber using two imaging charged particle beam microscopes distanced from each other. The substrate is processed as a whole in the vacuum chamber. In particular, embodiments described herein do not require breaking the substrate or etching the surface of the substrate. Accordingly, a high-resolution image for critical dimension measurement can be provided.

An advantage of having a vacuum chamber with reduced dimensions, as provided by some embodiments described herein, is that one or more vibrations of the vacuum chamber may be reduced, since the level of vibration increases as a function of the size of the vacuum chamber. Accordingly, the vibration amplitude of the substrate may be advantageously reduced as well.

According to some embodiments, which can be combined with other embodiments described herein, and apparatus for inspecting a large area substrate may further include a controller 180. The controller 180 can be connected (see reference numeral 182) to the substrate support 110, and particularly a displacement unit of the substrate support. Further, the controller 180 can be connected to a scanning deflector assembly 184 of an imaging charged particle beam microscope, such as the first imaging charged particle beam microscope 130 and the imaging second charged particle beam microscope 140.

The controller 180 comprises a central processing unit (CPU), a memory and, for example, support circuits. To facilitate control of the apparatus for inspecting a large area substrate, the CPU may be one of any form of general purpose computer processor that can be used in an industrial setting for controlling various chambers and sub-processors. The memory is coupled to the CPU. The memory, or a computer readable medium, may be one or more readily available memory devices such as random access memory, read only memory, floppy disk, hard disk, or any other form of digital storage either local or remote. The support circuits may be coupled to the CPU for supporting the processor in a conventional manner. These circuits include cache, power supplies, clock circuits, input/output circuitry and related subsystems, and the like. Inspecting process instructions are generally stored in the memory as a software routine typically known as a recipe. The software routine may also be stored and/or executed by a second CPU (not shown) that is remotely located from the hardware being controlled by the CPU. The software routine, when executed by CPU, transforms the general purpose computer into a specific purpose computer (controller) that controls the apparatus operation such as that for controlling the substrate support positioning and charged particle beam scanning during the imaging process. Although the method and/or process of the present disclosure is discussed as being implemented as a software routine, some of the method steps that are disclosed therein may be performed in hardware as well as by the software controller. As such, the invention may be implemented in software as executed upon a computer system, and hardware as an application specific integrated circuit or other type of hardware implementation, or a combination of software and hardware.

The controller may execute or perform a method for automated critical dimension measurement on a substrate for display manufacturing. The method according to some embodiments includes scanning a first field of view having a first size with a charged particle beam to obtain a first image having a first resolution of a first portion of the substrate for display manufacturing; determining a pattern within the first image, the pattern having a first position; scanning a second field of view with the charged particle beam to obtain a second image of a second portion of the substrate, the second field of view has a second size smaller than the first size and has a second position provided relative to the first position, the second image has a second resolution higher than the first resolution; and determining a critical dimension of a structure provided on the substrate from the second image.

FIG. 5 illustrates an example of such a method. The controller 180 (see FIG. 1) can provide signals to move the substrate support to a desired position below an imaging charged particle beam microscope. The charged particle beam, such as an electron beam, is scanned over a first field of view 590. The first image obtained by scanning the first field of view includes a pattern 592. The first image has a first resolution, which is low to enable sufficient throughput. The first resolution is, however, high enough to enable a determining of the pattern 592 and the first position 594 of the pattern. A second field of view 190 has a position relative to the first position 594, as indicated exemplarily by the arrow in FIG. 5. The second field of view 190 shown in FIG. 5 can be considered as one of one or more measurement boxes, which are scanned with the charged particle beam at a second resolution higher than the first resolution. For example, the size of the second field of view can be smaller than the size of the first field of view. Accordingly, the higher resolution of an image generated by scanning the second field of view has a less negative impact on the throughput of the CD measurement. Scanning the second field of view 190, i.e. the measurement box, results in a second image. The second image has a resolution which is higher than that of the first image. A critical dimension of the structure on the substrate for display manufacturing can be determined based on the second image.

FIG. 4 shows a side view of another apparatus for inspecting a substrate, according to embodiments described herein. The apparatus 100 includes a vacuum chamber 120. The apparatus 100 further includes a substrate support 110 on which a substrate 160 may be supported. The apparatus 100 includes a first imaging charged particle beam microscope 130. Contrary to FIG. 1, FIG. 4 shows a single imaging charged particle beam microscope provided above the substrate support 110. Even though this may result in reduced imaging capability, for example reduced resolution, the resulting resolution may be sufficient for some CD measurements. Similarly to FIG. 1, the apparatus shown in FIG. 4 may include a controller and a deflection assembly.

The controller can be connected to the substrate support, and particularly a displacement unit of the substrate support. Further, the controller can be connected to the deflection assembly of the imaging charged particle beam microscope.

Critical dimension measurements are typically provided on various areas of a substrate, such as a wafer in semiconductor manufacturing or such as a large area glass substrate for display manufacturing. The critical dimension of a structure can, thus, be analyzed statistically over the entire substrate area and over a plurality of processed substrates. For a small substrate, such as a wafer, this may be done with methods known from the semiconductor industry with sufficient throughput. A matching of measurement capabilities is provided tool-to-tool in the semiconductor industry. For electron beam review (EBR) of display substrates, two imaging charged particle beam microscope in one inspection apparatus (see FIG. 1) can be matched relative to each other. This relates to relative positions as well as measurement capabilities. A single column inspection apparatus (see FIG. 4) may avoid the matching of columns in one system while accepting a reduced resolution. A multiple column inspection apparatus may beneficially include a column matching and has an increased resolution.

Both options allow for the improved CD measurement processes described herein, wherein sufficient accuracy as well as sufficient throughput is provided on large area substrates. According to embodiments of the present disclosure, CD measurements as described herein can be provided in various areas of the large area substrate. For example, 5 areas to 100 areas can be distributed over the substrate. For example, the areas can be evenly distributed over the substrate. Areas distributed over the substrate allow for a uniformity analysis of the critical dimension over the substrate, particularly the entire substrate.

An imaging charged particle beam microscope, as used herein, may be adapted for generating a low-energy charged particle beam having a landing energy of 2 keV or below, particularly of 1 keV or below. Compared to high-energy beams, low energy beams do not impact or deteriorate a display backplane structure during critical dimension measurements. According to yet further embodiments, which can be combined with other embodiments described herein, the charged particle energy, for example the electron energy, can be increased to 5 keV or above, such as 10 keV or above between the particle beam source and the substrate. Accelerating the charged particles within the column reduces interaction between the charged particles, reduces aberrations of electro-optical components, and, thus, improves the resolution of the imaging scanning charged particle beam microscope.

According to yet further embodiment, which can be combined with other embodiments described herein, the term "substrate" as used herein embraces both inflexible substrates, e.g., a glass substrate, or a glass plate, and flexible substrates, such as a web or a foil. The substrate may be a coated substrate, wherein one or more thin layers of materials are coated or deposited on the substrate, for example by a physical vapor deposition (PVD) process or a chemical vapor deposition process (CVD). A substrate for display manufacturing typically includes and insulating material, for example glass. Accordingly, contrary to typical semiconductor wafer SEMs, an apparatus for inspecting a large area substrate does not allow for biasing the substrate. According to embodiments described herein, which can be combined with other embodiments described herein, the substrate is grounded. The substrate cannot be biased to a potential for influencing the landing energy or other electro-optical aspects of the scanning electron beam microscope. This is a further example of the differences between an EBR system for large area substrates and semiconductor wafer SEM inspection. This may further result in problems with electrostatic discharge (ESD) upon substrate handling on the substrate support. Accordingly, it can be seen that wafer inspection schemes may not easily be applied for CD measurement of substrate for display manufacturing.

Figure 6A:
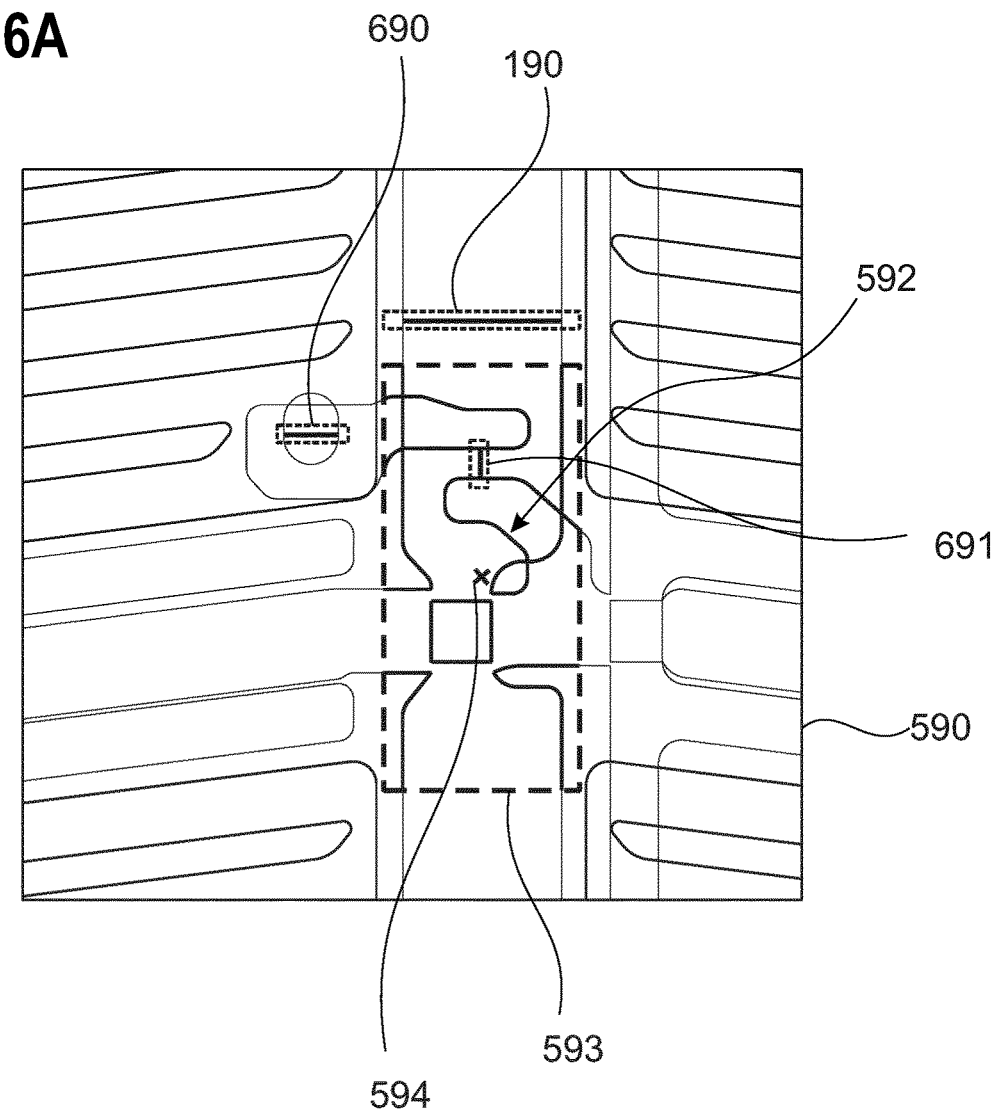
FIGS. 6A and 6B show exemplary results of an automated CD measurement.

FIG. 6A shows an example of a CD measurement according to embodiments of the present disclosure. The large area substrate and the imaging charged particle beam microscope are moved relative to each other, for example by movement of the substrate support (see 110 in FIGS. 1 and 4), to an area of the substrate, in which one or more structures for CD measurement are located. A first (larger) field of view (FOV) 590 is scanned with the charged particle beam. A resulting image is show in FIG. 6A. The image includes a pattern 592, which is highlighted by box 593 in FIG. 6A.

According to embodiments of the present disclosure, the pattern can include one or more features selected from the group consisting of: via, lines, trenches, connections, material boundaries, etched layer structures or the like. The pattern 592 has a predetermined position in the area to be reviewed for CD measurement. The pattern has a size and/or an amount of features such that a location 594 can be determined. For example, the pattern and the pattern location can be determined by pattern recognition techniques. Due to the structure of the pattern and the plurality of features of the pattern, the first location can be provided with a sufficient precision within the first FOV 590. For example, the first location can be provided with a precision of 200 nm or better.

According to some embodiments, which can be combined with other embodiments described herein, the size of the first field of view, i.e. a dimension of a scanned rectangular portion of the substrate, can be 50 µm to 200 µm. Considering a pixel resolution of, for example 512 pixels, the resolution of the first image can be about 100 nm to 400 nm. As described above, the first location can be provided with a precision of about 400 nm or better, such as 100 nm or better. The measurement box, for example a second field of view, is determined relative to the position 594 of the pattern 592. The measurement box, for example the first measurement box can be measured with a higher resolution. For example, a resolution of 60 nm or below, such as 20 nm or below, for example, 10 nm or below can be provided.

Figure 6B:
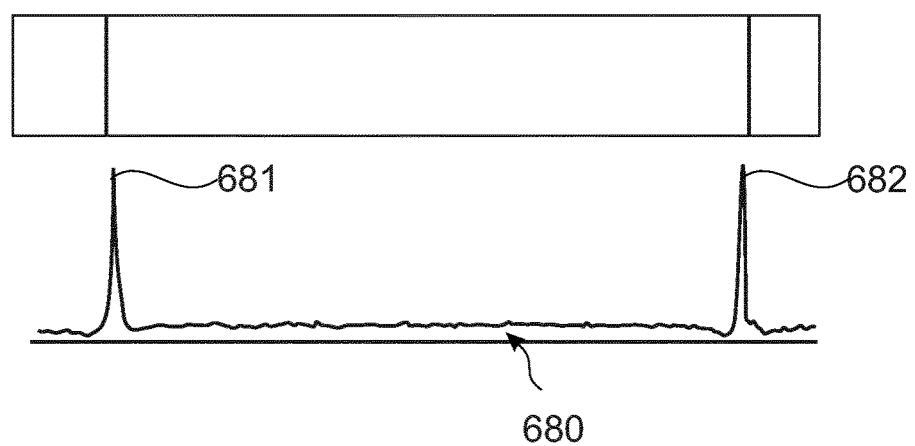

In the example shown in FIG. 6A, the measurement box of the second field of view 190 is about 25 µm in length. For example, 10 to 20 scan lines can be provided in the second field of view 190, for example, used to calculate an averaged scan line with better signal to noise ratio. The corresponding result of the intensity of the signal of signal electrons is shown in FIG. 6B. Considering a pixel resolution of for example 512 pixels, resolution of about 50 nm can be provided in measurement box, i.e. the second field of view 190.

According to embodiments of the present disclosure, CD measurement is provided in the measurement box, i.e. a second field of view having a size smaller than the first field of view and having a resolution of the second image of the second field of view that is higher as compared to the resolution of the first image of the first field of view. The corresponding CD measurement is shown in FIG. 6B. The signal intensity along the measurement box is shown. The signal 680 has a first peak 681 and a second peak 682. The distance of the two peaks can be measured as the critical dimension. According to yet further embodiments, signals of each scan line in the second field of view 190 may be averaged.

According to yet further embodiments, which can be combined with other embodiments described herein, a line as shown in FIG. 6A in the first field of view 190 can be visualized in the first image, i.e. the image of the lower resolution. Accordingly, the CD measurement measured at a high resolution can be visualized in an image of lower resolution for improved utilization of the measurement results of the user. The entire process, for example, including the visualization of the CD measurement result in the larger field of view, can be fully automated.

FIG. 6A shows a second measurement box 690, such as the third field of view, and a third measurement box 691, such as the fourth field of view. Each further measurement box can be positioned relative to the first position 594 of the pattern 592. Accordingly, additional high-resolution CD measurements can be provided based on the first field of view 590. This may further increase the throughput of CD measurement on a large area substrate.

According to some embodiments, which can be combined with other embodiments described herein, the measurement box can be a rectangular portion of the substrate with an arbitrary aspect ratio of the rectangle and/or an arbitrary size. Further, the orientation of the rectangles can be freely chosen. For example, FIG. 6A shows two landscape oriented rectangles and one portrait oriented rectangle.

According to some embodiments, which can be combined with other embodiments described herein, the measurement box can be a rectangular portion of the substrate, the rectangular portion having a length and the width. For example, the orientation can be an arbitrary angle in a Cartesian coordinate system of a rectangular substrate. FIG. 6A shows landscape oriented rectangles, which may be considered to have a 0° angle with respect to the substrate, and a portrait oriented rectangle, which may be considered to have a 90° angle with respect to the substrate. Also other angles deviating from 0° and 90° may be provided. For example, according to embodiments of the present disclosure, the length of a rectangle can be oriented to expand along the critical dimension. The width of a rectangle may, for example, correspond to the number of lines for which the critical dimension is measured. For example an average of these number of lines can be provided.

According to yet further embodiments, which can be combined with other embodiments described herein, the length of the measurement box can be chosen to adjust the resolution of the CD measurement. According to yet further embodiments, which can be combined with other embodiments described herein, the high resolution of a second field of view can be 20 nm or below, such as 10 nm or below, for example 5 nm or below. Further, additionally or alternatively, the high resolution can be 2 nm or above, such as 5 nm or above.

Methods according to the present disclosure allow to perform automated critical measurement (ACD) at a faster speed (increase throughput) and higher accuracy level (higher resolution) compared to conventional SEM based CD measurements in display manufacturing.

According to yet further embodiments, which can be combined with other embodiments described herein, automated critical dimension measurements on large area displays for display manufacturing may further distinguish over semiconductor wafer CD based on the scanning technique. Generally, an analog scanning technique and a digital scanning technique may be distinguished. An analog scanning technique may include an analog sawtooth signal provided to the scanning deflector assembly with a predetermined frequency. The sawtooth signal can be combined with a continuous or quasi-continuous substrate movement to a scan area of the substrate. A digital scanning technique provides discrete values for x-positioning and y-positioning of the charged particle beam on the substrate and the individual pixels of a scanned image are addressed pixel-per-pixel by coordinate values, i.e. digitally. An analog scanning technique ("flying stage") that may be considered preferable for semiconductor wafer SEM inspection due to the scanning speed and the reduced complexity, it is not beneficial for CD measurement on large area substrates. Due to the size of the substrate, the areas to be scanned are scanned digitally, i.e. by providing a list of the desired beam position coordinates. That is, the first FOV, i.e. the larger FOV; and the second FOV, i.e. the smaller FOV, are both scanned with a digital scanning technique, i.e. a digital scanner. Due to the size of the substrate, such a scanning process provides better throughput and accuracy.

Figure 2:
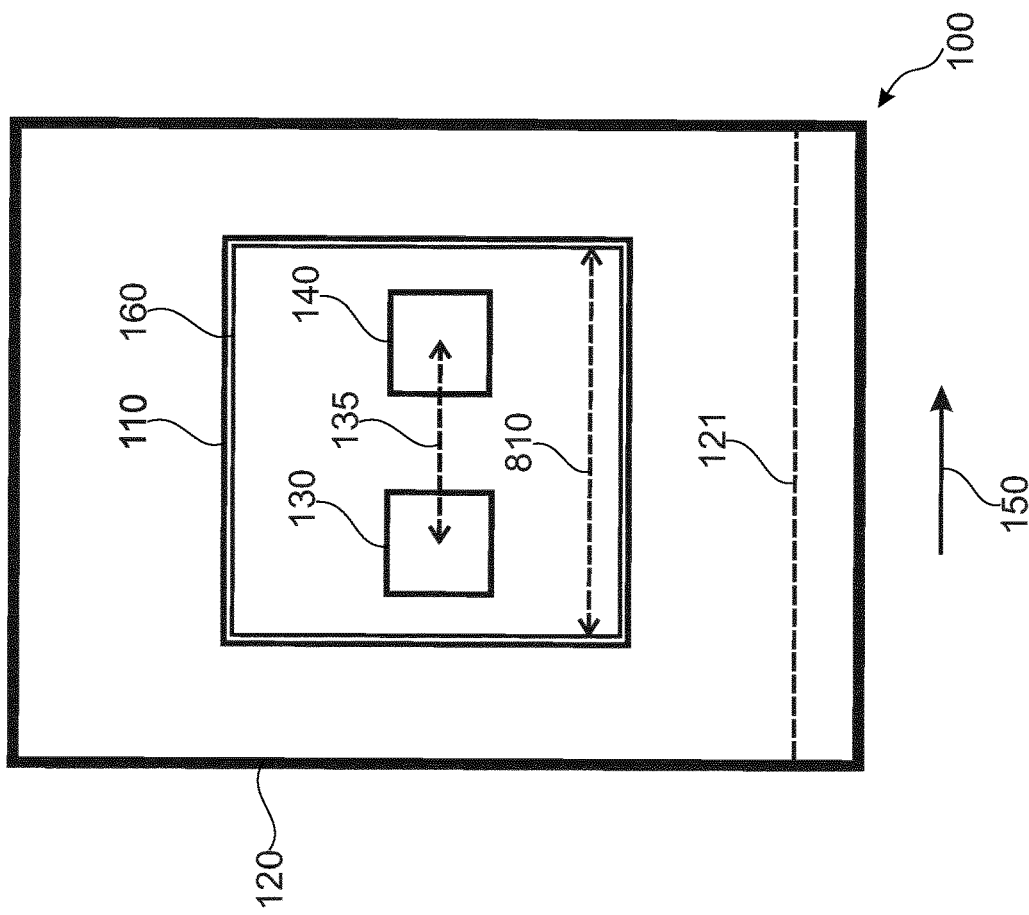
FIGS. 2 and 3 show top views of an apparatus for inspecting a substrate, according to embodiments described herein.
Figure 3:
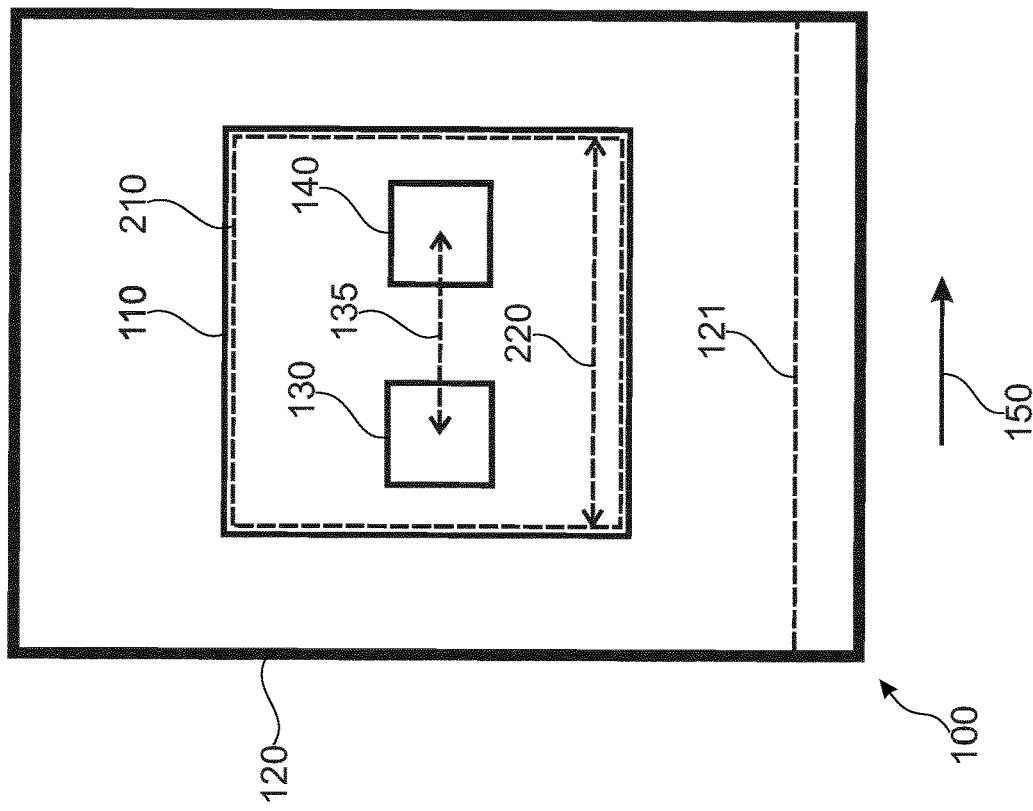

FIGS. 2 and 3 show a substrate 160 on a substrate support. The substrate support provides a substrate receiving area. The terminology of a "substrate receiving area", as used herein, can include a maximal area of the substrate support available for receiving a substrate. In other words, the substrate support may be adapted for receiving a substrate having the same spatial dimensions as the substrate receiving area, or for receiving a substrate having one or more smaller spatial dimensions compared to the substrate receiving area, so that the substrate fits within the substrate receiving area. FIG. 2 illustrates an embodiment of the apparatus 100, wherein the substrate support 110 provides a substrate receiving area 210. In the exemplary embodiment illustrated in FIG. 2, the substrate receiving area 210 is rectangular as indicated by the dashed line. Accordingly, the substrate receiving area 210 may be adapted for receiving a rectangular substrate (not shown) which has the same length and width (or a smaller length and width) as the rectangular substrate receiving area 210 shown in FIG. 2. As an example, FIG. 3 shows a rectangular substrate 160 provided on the substrate support 110, wherein the size of the substrate 160 shown in FIG. 3 is substantially identical to the size of the substrate receiving area 210 shown in FIG. 2. In particular, the length and the width of the substrate 160 shown in FIG. 3 are substantially the same as the length and the width, respectively, of the substrate receiving area 210 shown in FIG. 3. In other words, additionally or alternatively the substrate has a length and width each of which is from 90% to 100% of the substrate receiving area.

The substrate receiving area has a first receiving area dimension along a first direction. With respect to the figures described herein, the first direction may refer to the x-direction 150. The first direction may be parallel to the substrate support. The substrate support may be displaceable along the first direction. The first receiving area dimension of the substrate receiving area may include an extent, width, length or diameter of the substrate receiving area along the first direction. Alternatively or additionally, the first receiving area dimension may refer to the maximal width, along the first direction, of a substrate that can be received by the substrate support. For example, referring to the apparatus shown in FIG. 2, the first receiving area dimension of the substrate receiving area along the first direction may refer to width 220 of the substrate receiving area 210 along the x-direction 150. The width 220 may correspond to the maximal width, along the x-direction 150, of a substrate that can be received by the substrate support 110. As an example, the substrate 160 shown in FIG. 3 has a substrate width 810 along the x-direction 150, wherein the substrate width 810 is essentially the same as the width 220 of the substrate receiving area 210 shown in FIG. 2.

The exemplary first imaging charged particle beam microscope and the second imaging charged particle beam microscope have a distance along the first direction in the range from 30% to 70% of the first receiving area dimension of the substrate receiving area. More particularly, the distance along the first direction may lie in the range from 40% to 60% of the first receiving area dimension, e.g. about 50% of the first receiving area dimension. For example, referring to the embodiment illustrated in FIG. 2, the distance along the first direction may refer to the distance 135 between the first imaging charged particle beam microscope 130 and the second imaging charged particle beam microscope 140. In the exemplary embodiment illustrated in FIG. 2, the distance 135 is approximately 50% of the width 220 of the substrate receiving area 210.

The substrate support may be movable in the vacuum chamber with respect to the first imaging charged particle beam microscope and/or with respect to the second imaging charged particle beam microscope. According to embodiments, which can be combined with other embodiments described herein, the second imaging charged particle beam microscope is distanced from the first imaging charged particle beam microscope by a distance of at least 30 cm, more particularly a distance of at least 40 cm, such as about 50% of the first receiving area dimension. An advantage of having a minimum distance between the first imaging charged particle beam microscope and the second imaging charged particle beam microscope, i.e. a distance that is larger than merely duplicating two imaging charged particle beam microscopes next to each other for redundancy, e.g. two SEMS next to each other, is that the distance over which a substrate inspected by the apparatus travels is reduced. This allows for a reduced size of the vacuum chamber, so that the vibrations of the vacuum chamber can be advantageously reduced as well.

Due to the size of the substrates for display manufacturing and the resulting challenges for the manufacturing processes, critical dimension measurements are also adapted to large area substrates as described with respect to embodiments of the present disclosure. For example, a display may have 5 million pixels or above, such as about 8 million pixels. Large displays may include even higher number of pixels. For each pixel, at least an electrode for red, an electrode for green, and an electrode for blue (RGB) are provided. Accordingly, structures on a substrate, which may include dimensions that are considered critical for the manufacturing process (critical dimension), may occur in a very large amount and over a very large area. As described above, embodiments of the present disclosure include scanning a first field of view with a first, lower resolution, determining a first position based on a pattern in the first field of view, scanning a second field of view positioned relative to the first position with a second, higher resolution, and providing CD measurement based on an image having the higher resolution. The CD measurement is provided at a structure in the second field of view, and, for example, also in the first field of view, i.e. the second field of view is provided within the first field of view. According to some embodiments, one or more CD measurements can be provided at the structure. Additionally or alternatively, two or more structures for further CD measurements can be provided in the first field of view.

Due to the nature of the display, a very high number of corresponding structures may be provided. For display manufacturing, it is, particularly in light of the large area to be processed, important to learn whether a structure can be manufactured reliably at all positions of the large area substrate. Uniformity of manufacturing processes over the area of the substrate are often considered when characterizing the manufacturing process. Accordingly, one or more types of structures are to be evaluated, for example by CD measurement, on different locations on the substrate. These locations may be distributed over the entire area of the substrate, for example, evenly distributed over the substrate. In light of the above, according to some embodiments, which can be combined with other embodiments described herein, a method of inspecting a large area substrate for display manufacturing can be provided. The method includes (a) imaging a first portion of the substrate in a first area having a first type of structure to obtain a first image; (b) determining a pattern within the first portion; (c) imaging a second portion of the substrate in the first area to obtain a second image having a higher resolution than the first image; (d) determining a critical dimension of the first type of structure in the first area; and repeating (a) to (c) in a plurality of areas on the large area substrate, the plurality of areas being distributed over at least 1.2 m² on the large area substrate.

FIG. 7 shows another example of an apparatus for inspection of the large area substrate. For example, in the apparatus shown in FIG. 7, the first imaging charged particle beam microscope 130 and the second imaging charged particle beam microscope 140 extend along the z-direction 151 i.e. perpendicularly to the x-direction 150 and to the y-direction 152, wherein the x-y plane is parallel to the substrate support 110. Alternatively, the first imaging charged particle beam microscope and/or the second imaging charged particle beam microscope may be tilted with respect to the substrate support and/or the first direction. The first imaging charged particle beam microscope and/or the second imaging charged particle beam microscope may extend along a direction making an angle with the first direction, wherein the angle is different from 90 degrees. In particular, the angle may lie in the range from 60 to 90 degrees, more particularly from 75 to 90 degrees. According to yet further embodiments, which can be combined with other embodiments described herein, the imaging charged particle beam microscope column may be arranged perpendicular to the substrate support and the imaging charged particle beam microscope optics may be configured to tilt the charged particle beam, e.g. by an angle of up to 20°. Having a charged particle beam, which is tilted with respect to the surface normal of the substrate, can be utilized for topography imaging or even 3D images with a high resolution, i.e. a resolution of 10 nm or below. Further details of tilting the charged particle beam can be understood with reference to FIGS. 8B and 8C.

FIG. 7 shows a side view of an apparatus for inspecting a substrate, according to embodiments described herein. The apparatus includes a displacement unit 410. The displacement unit 410 is adapted for displacing the substrate support along a first direction, e.g. along the x-direction 150 to position the substrate support 110 in below the first imaging charged particle beam microscope 130 and/or below the second imaging charged particle beam microscope 140. The displacement unit 410 may be adapted for moving the substrate support 110 forward and backward along the x-direction 150, i.e. toward the right and toward the left in FIG. 7. According to embodiments, which can be combined with other embodiments described herein, the apparatus described herein further includes a displacement unit, such as e.g. displacement unit 410 shown in FIG. 7. The displacement unit may be adapted for displacing the substrate support along the first direction. The displacement unit 410 may e.g. include a plurality of linear actuators (not shown) on which the substrate support 110 rests. Alternatively or additionally, the displacement unit may e.g. include a magnetic guiding system (not shown) for guiding the substrate support 110 along the x-direction 150. In the schematic representation shown in FIG. 7, the displacement unit 410 is arranged in the vacuum chamber 120. Alternatively, part of the displacement unit 410 may extend outside of the vacuum chamber 120, in particular if the apparatus 100 is coupled to a load lock chamber or is an inline apparatus. A displacement unit 410 extending outside of the vacuum chamber 120 may be adapted for transporting the substrate support 110 into and out of the vacuum chamber 120. For example, the displacement unit 410 may extend outside of the vacuum chamber 120 on the right hand side of the vacuum chamber 120 and on the left hand side of the vacuum chamber 120. Accordingly, the substrate support 110 may e.g. be moved into the vacuum chamber 120 by the displacement unit 410 from the left and may be moved out of the vacuum chamber 120 by the displacement unit 410 to the right.

The displacement unit may be adapted for displacing the substrate support along the first direction from a position proximate to a first end or wall of the vacuum chamber to a position proximate second end or wall of the vacuum chamber. The displacement unit may have a displacement range along the first direction, wherein the displacement unit may be adapted for displacing the substrate support to an arbitrary target coordinate within the displacement range.

The apparatus shown in FIG. 7 may further include a further displacement unit (not shown) adapted for displacing the substrate support 110 in the vacuum chamber 120 along the y-direction 152. The displacement unit 410 and the further displacement unit may form a common displacement system adapted for moving the substrate support 110 in an x-y plane. Accordingly, by suitably moving the substrate support 110 holding the substrate in the x-y plane, any area of a substrate disposed on the substrate support 110 may be positioned below the first imaging charged particle beam microscope 130 or below the second imaging charged particle beam microscope 140 for CD measurement of the target portion. The substrate support may be mounted onto the further displacement unit or on a common displacement system formed by the displacement unit and the further displacement unit. The further displacement unit may be adapted for displacing the substrate support relative to the first imaging charged particle beam microscope and/or relative to the second imaging charged particle beam microscope. The further displacement unit may have a displacement range along the first direction, wherein the displacement range may lie in the range from 150% to 180% of the substrate width or the respective width of the substrate receiving area. The vacuum chamber may have a first inner dimension along the first direction of 150% to 180% of the first receiving area dimension along the first direction.

The apparatus 100 shown in FIG. 7 further includes a vacuum pump 420 adapted for generating a vacuum in the vacuum chamber 120. The vacuum pump 420 is fluidly coupled to the vacuum chamber 120 via connection 430, e.g. a conduit, wherein the connection 430 connects the vacuum pump 420 with the vacuum chamber. Via the connection 430, the vacuum pump 420 may evacuate the vacuum chamber. Accordingly, a pressure of e.g. $10^{-1}$ mbar or below may be provided in the vacuum chamber. During operation, the vacuum pump 420 may vibrate. Via the connection 430, which is attached to the vacuum pump 420 and to the vacuum chamber 120, mechanical vibrations of the vacuum pump 420 may be transmitted to the vacuum chamber 120. Accordingly, undesired vibrations may be transmitted to the vacuum chamber 120 and/or to a substrate (not shown) positioned on the substrate support 110. To dampen vibration of the vacuum pump 420, a vibration damper 431 is included in the apparatus 100, more particularly in the connection 430. As shown, the vibration damper 431 is coupled to the vacuum pump 420 via a first coupling 432 and to the vacuum chamber 120 via a second coupling 433.

FIG. 7 further shows a vibration sensor 450 adapted for measuring the vibration of the vacuum chamber 120. For example, the vibration sensor may be adapted for measuring amplitudes and/or frequencies of the vibrations of the vacuum chamber 120. The vibration sensor 450 may further be adapted for measuring vibrations in one or more directions. The vibration sensor 450 may include an optical source (not shown) adapted for generating an optical beam. The optical beam may be directed onto the vacuum chamber 120, for example onto a wall of the vacuum chamber 120, wherein at least part of the optical beam may be reflected from the vacuum chamber. The vibration sensor 450 may further include a detector (not shown) for detecting the optical beam after being reflected from the vacuum chamber 120. Accordingly, information about the vibration of the vacuum chamber 120 may be collected by the vibration sensor 450. The vibration sensor may be an interferometer.

According to some embodiments, the vibration sensor is configured for measuring vibrations influencing the relative position between the imaging charged particle beam microscope and the substrate support. As shown in FIG. 7, this measurement may be conducted at the vacuum chamber in light of the relatively large amplitudes generated at the vacuum chamber. According to yet further or additional implementations, a vibration sensor, e.g. an interferometer or an piezo vibration sensor, can be mounted at the substrate support to measure the relative position (and position variation) of the imaging charged particle beam microscope or may be mounted to the imaging charged particle beam microscope to measure the relative position (and position variation) of the substrate support.

Data collected by the vibration sensor 450 regarding the relative position between the imaging charged particle beam microscope and the substrate support and/or the vibrations of the vacuum chamber 120 may be transmitted to a control unit (e.g. controller 180 in FIG. 1). Using the data collected by the vibration sensor 450, the control unit may control the apparatus 100. In particular, using the data collected by the vibration sensor 450, the control unit may control the first imaging charged particle beam microscope 130, the second imaging charged particle beam microscope 140, the displacement unit 410 or other components included in the apparatus 100, e.g. to temporarily pause the CD measurement of the substrate if the vibration sensor 450 indicates that the vibration of the vacuum chamber range exceed a predetermined limit. Yet further additionally or alternatively, the measurement of the relative position may be used to correct the images with an appropriate correction factor resulting from the measurement of the relative position.

Figure 8A:
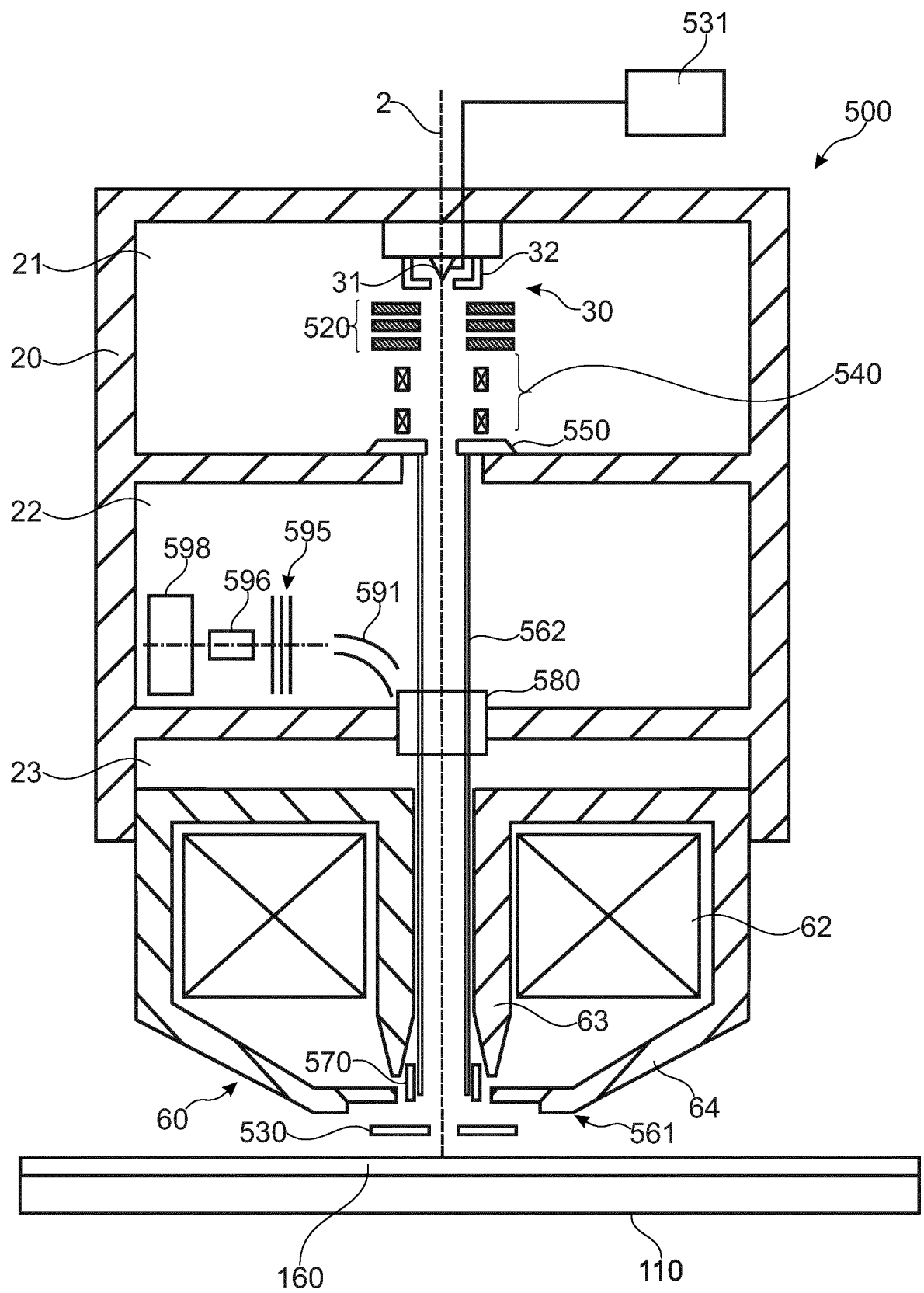
FIG. 8A shows a side view of an imaging charged particle beam microscope, i.e. an exemplary apparatus for inspecting a substrate, according to embodiments described herein.

FIG. 8A shows an imaging charged particle beam microscope, i.e. a charged particle beam device 500, such as the first imaging charged particle beam microscope and/or the second imaging charged particle beam microscope, as described herein. The charged particle beam device 500 includes an electron beam column 20 providing e.g. a first chamber 21, a second chamber 22 and a third chamber 23. The first chamber, which can also be referred to as a gun chamber, includes an electron beam source 30 having an emitter 31 and suppressor 32.

The emitter 31 is connected to a power supply 531 for providing a potential to the emitter. The potential provided to the emitter may be such that the electron beam is accelerated to an energy of e.g. 20 keV or above. Accordingly, the emitter may be biased to a potential of −1 kV voltages to provide landing energy of 1 keV for a grounded substrate. An upper electrode 562 is provided at a higher potential for guiding the electrons through column at a higher energy.

With the device shown in FIG. 8A, an electron beam (not shown) may be generated by the electron beam source 30. The beam may be aligned to the beam limiting aperture 550, which is dimensioned to shape the beam, i.e. blocks a portion of the beam. Thereafter, the beam may pass through the beam separator 580, which separates the primary electron beam from a signal electron beam, i.e. from signal electrons. The primary electron beam may be focused on the substrate 160 by the objective lens. The substrate 160 is positioned on a substrate position on the substrate support 110. On impingement of the electron beam onto the substrate 160 signal electrons, for example, secondary and/or backscattered electrons or x-rays are released from the substrate 160, which can be detected by a detector 598.

In the exemplary embodiment illustrated in FIG. 8A, a condenser lens 520 and a beam shaping or beam limiting aperture 550 are provided. The two-stage deflection system 540 is provided between the condenser lens and the beam limiting aperture 550, e.g. a beam shaping aperture, for alignment of the beam to the aperture. The electrons may be accelerated to the voltage in the column by an extractor or by the anode. The extractor can, for example, be provided by the upper electrode of the condenser lens 520 or by a further electrode (not shown).

As shown in FIG. 8A, the objective lens has a magnetic lens component 561 having pole pieces 64 and 63 and having a coil 62, which focuses the primary electron beam on the substrate 160. The substrate 160 can be positioned on the substrate support 110. The objective lens shown in FIG. 8A includes the upper pole piece 63, the lower pole piece 64 and the coil 62 forming a magnetic lens component 60 of the objective lens. Further, the upper electrode 562 and a lower electrode 530 form an electrostatic lens component of the objective lens.

Further, in the embodiment illustrated in FIG. 8A, a scanning deflector assembly 570 is provided. The scanning deflector assembly 570 (see also scanning deflector assembly 184 in FIG. 1) can, for example, be a magnetic, but preferably an electrostatic scanning deflector assembly, which is configured for high pixel rates. The scanning deflector assembly 570 may be a single stage assembly, as shown in FIG. 8A. Alternatively, also a two-stage or even a three-stage deflector assembly can be provided. Each stage is provided at a different position along the optical axis 2.

The lower electrode 530 is connected to a voltage supply (not shown). The embodiment illustrated in FIG. 8A shows the lower electrode 530 below the lower pole piece 64. The lower electrode being the deceleration electrode of the immersion lens component; i.e. a retarding field lens component, of the objective lens is typically at a potential to provide a landing energy of the charged particles on the substrate of 2 keV or below, e.g. 500 V or 1 keV.

The beam separator 580 is adapted for separating the primary and the signal electrons. The beam separator can be a Wien filter and/or can be at least one magnetic deflector, such that the signal electrons are deflected away from the optical axis 2. The signal electrons are then guided by a beam bender 591, e.g. a hemispherical beam bender, and a lens 595 to the detector 598. Further elements like a filter 596 can be provided. According to yet further modifications, the detector can be a segmented detector configured for detecting signal electrons depending on the starting angle at the specimen.

The first imaging charged particle beam microscope and the second imaging charged particle beam microscope may be charged particle beam devices of an imaging charged particle beam microscope type, such as e.g. the charged particle beam device 500 shown in FIG. 8A.

Figure 8B:
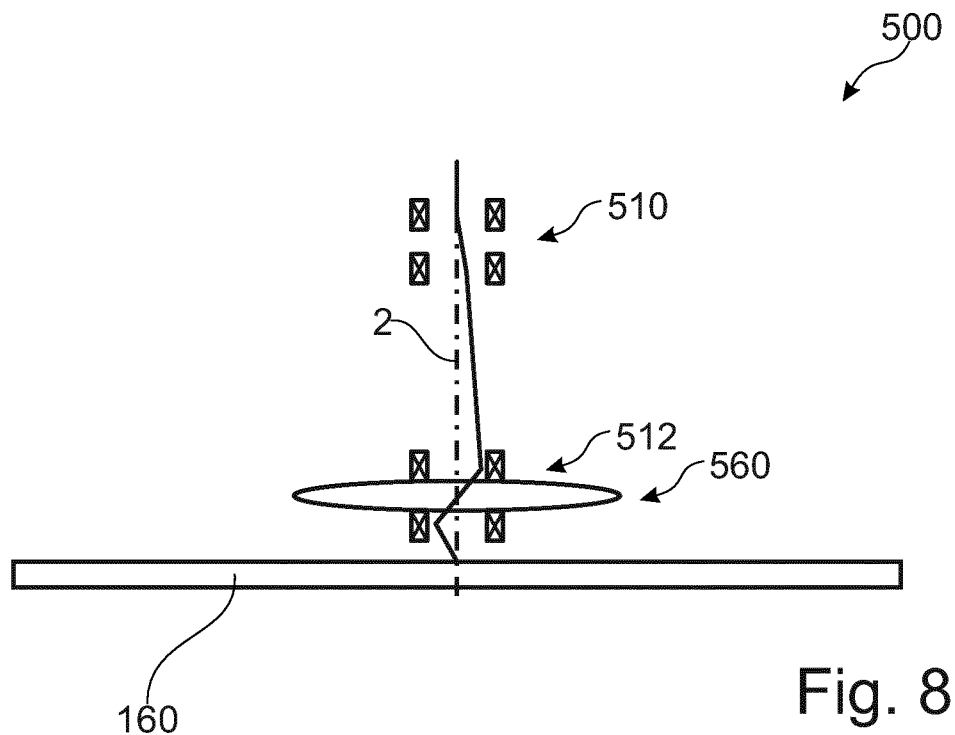
FIGS. 8B and 8C show schematic views of tilting a charged particle beam in an imaging charged particle beam microscope according to embodiments described herein.
Figure 8C:
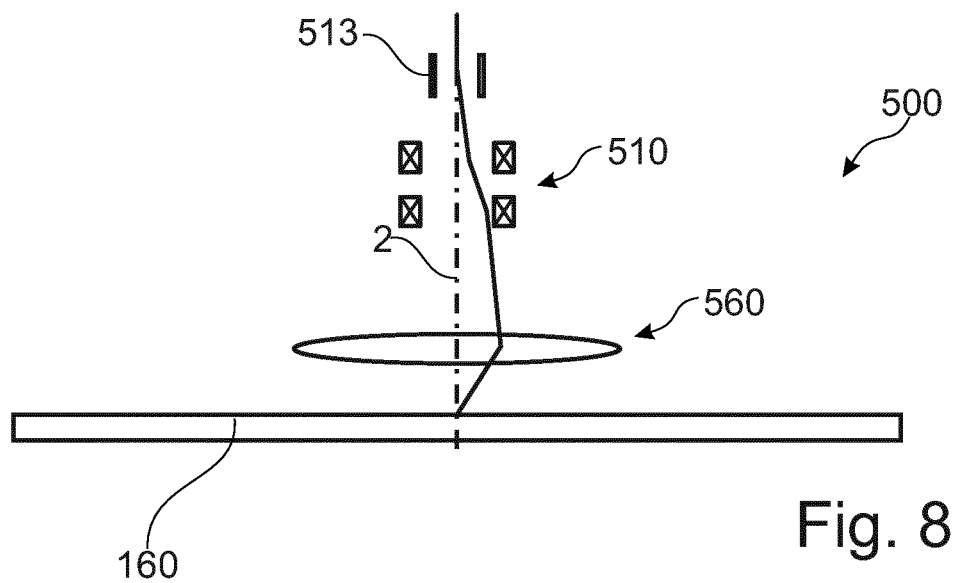
Figure 9:
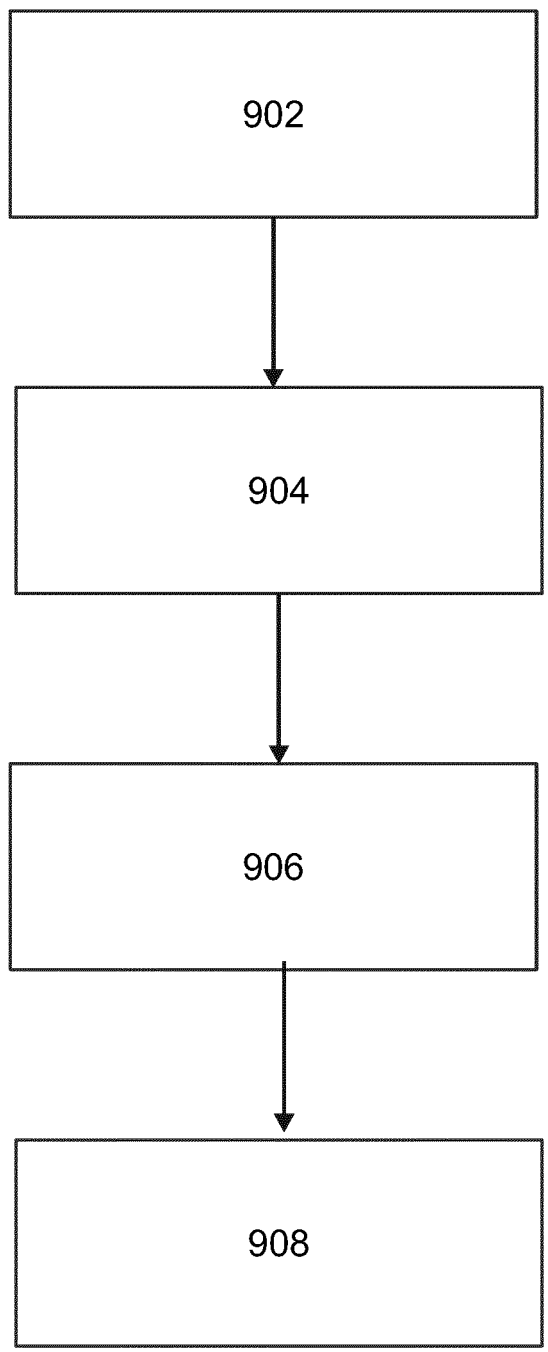
FIG. 9 shows a flow chart illustrating a method of automated CD measurement on a large area substrate, e.g. for display manufacturing, according to embodiments of the present disclosure.

FIGS. 8B and 8C illustrate further optional embodiments of portions of a charged particle beam device 500. In FIGS. 8A and 8B options to tilt the primary charged particle beam to impinge on the substrate under a predetermined tilted beam landing angle are shown. According to embodiments described herein, an imaging charged particle beam microscope as described herein may be utilized for imaging with one or more tilted beams. Accordingly, 3D imaging, imaging of steps, imaging of trenches, holes, and/or imaging of protrusions can be improved.

According to some embodiments, which can be combined with other embodiments described herein, critical dimension measurements can be provided for the shape of a structure, for example, a hole or a pillar may have circular shape based upon a perfectly manufactured structure. In reality, the hole or the pillar may deviate from having a perfectly circular shape but may be slightly oval or elliptical. Accordingly, the roundness or other ratios of shapes may be measured with a CD measurement according to embodiments of the present disclosure. Particularly for holes, openings, pillars or other three-dimensional structures, and measurement with a tilted beam or two measurements with two differently tilted beams (for example, subsequently) may be advantageous. Accordingly, according to some embodiments, which can be combined with other embodiments described herein, a charged particle beam tilt as described herein (for example with respect to FIGS. 8B and 8C) may be provided. Further, imaging with tilted beams may be utilized for the measuring of aspect ratios of shapes of structures. Aspect ratios (such as a structure being round vs. elliptical) may also be measured with non-tilted beams according to embodiments of the present disclosure. However, particularly aspect ratios of three-dimensional structures may advantageously be measured with, for example, stereoscopic images and/or tilted beams.

In FIG. 8B, a charged particle beam source (not shown) emits a charged particle beam to travel along the optical axis 2 towards the objective lens 560 which focuses the beam onto the surface of a substrate 160. The pre-lens deflection unit 510 can include two deflection coils deflect the beam from the optical axis 2. In light of the two stages, the beam can be deflected to seemingly emerge from a point coincident with the apparent position of the charged particle beam source. The pre-lens deflection unit 510 is arranged between the charged particle source and the objective lens 560. An in-lens deflection unit 512 can be provided inside the field of the objective lens such that the respective fields overlap. The in-lens deflection unit 512 can be a two-stage unit comprising two deflection coils. While the schematic sketch of FIG. 8B shows an arrangement where one of the coils is positioned above and one coil is positioned below the principal plane of the objective lens 560, other arrangement are also possible, particularly arrangements providing for an overlap between the fields of the in-lens deflection unit and the objective lens.

The in-lens deflection unit 512 can redirect the beam so that the beam crosses the center of the objective lens, i.e. the center of the focusing action, at the optical axis. The redirection is such that the charged particle beam hits the surface of the substrate from a direction, which is substantially opposite to the direction without the beam crossing the optical axis 2. The combined action of the in-lens deflection unit 512 and the objective lens 560 directs the primary charged particle beam back to the optical axis such that it hits the sample under the predetermined tilted beam landing angle.

In FIG. 8C, a charged particle beam source (not shown) emits a charged particle beam to travel along the optical axis 2 towards the objective lens 560 which focuses the beam onto the surface of a substrate 160. The deflection unit 510 comprises two deflectors to deflect the beam away from the optical axis. In light of the two stages, the beam can be deflected to seemingly emerge from a point coincident with the apparent position of the charged particle beam source. The pre-lens deflection unit 510 can be arranged between the charged particle source and the objective lens 560. Above the pre-lens deflection unit 510, a Wien filter 513 can be disposed which generates crossed electric and magnetic fields. The off-axis path of the charged particle beam trough the objective lens 560 causes a first chromatic aberration. The energy dispersive effect of the Wien filter 513 introduces a second chromatic aberration of the same kind as the first chromatic aberration. Appropriately choosing the strength of the electric field E and magnetic field B of the Wien filter, the second chromatic aberration can be adjusted to have the same magnitude but opposite direction as the first chromatic aberration. In effect, the second chromatic aberration substantially compensates the first chromatic aberration in the plane of the substrate surface. The primary charged particle beam is tilted by travelling off-axis through the objective lens 560 and the focusing action of the objective lens.

FIGS. 10a-d show examples of different arrangements of imaging charged particle beam microscopes, including the first imaging charged particle beam microscope and the second imaging charged particle beam microscope, in a vacuum chamber, according to embodiments described herein. The arrangement of the first imaging charged particle beam microscope 130 and the second imaging charged particle beam microscope 140 shown in FIG. 10a is similar to embodiments considered above. In particular, the first imaging charged particle beam microscope 130 and the second imaging charged particle beam microscope 140 are arranged along the x-direction 150. As indicated, both the first imaging charged particle beam microscope 130 and the second imaging charged particle beam microscope 140 are arranged at the same y-coordinate 710 with respect to the y-direction 152.

FIG. 10b shows the apparatus 100, wherein the first imaging charged particle beam microscope 130 is arranged in the vacuum chamber 120 at a first y-coordinate 720 and wherein the second imaging charged particle beam microscope is arranged at a second y-coordinate 721 different from the first y-coordinate. In the embodiment illustrated in FIG. 10b, the distance 135 between the first imaging charged particle beam microscope 130 and the second imaging charged particle beam microscope along the x-direction 150 is a distance between a first projection axis 722 and a second projection axis 723. The first projection axis 722 extends through the center 724 of the first imaging charged particle beam microscope 130 along the y-direction 152 and the second projection axis 723 extends through the center 725 of the second imaging charged particle beam microscope 140 along the y-direction. Mathematically speaking, the distance 135 between the first imaging charged particle beam microscope 130 and the second imaging charged particle beam microscope 140 along the x-direction 150 is a distance between two points A and B, where A is the orthogonal projection of the center 724 onto the x-direction 150 and B is the orthogonal projection of the center 725 onto the x-direction 150.

FIG. 10c illustrates an embodiment according to which the apparatus 100 further includes a third imaging charged particle beam microscope 750, and wherein the first imaging charged particle beam microscope 130, the second imaging charged particle beam microscope 140 and the third imaging charged particle beam microscope 750 are arranged along the x-direction 150. As indicated, the first imaging charged particle beam microscope 130, the second imaging charged particle beam microscope 140 and the third imaging charged particle beam microscope 750 are arranged at the same y-coordinate 730 with respect to the y-direction 152. The third imaging charged particle beam microscope 750 is distanced from the first imaging charged particle beam microscope 130 along the x-direction 150 by a distance 761 and distanced from the second imaging charged particle beam microscope 140 along the x-direction by a distance 762. In the exemplary embodiment, the first imaging charged particle beam microscope 130, the second imaging charged particle beam microscope 140 and the third imaging charged particle beam microscope 750 are linearly arranged in a symmetric manner, wherein the distance 761 is equal to the distance 762. Compared to an apparatus having two imaging charged particle beam microscopes, the inclusion of a third imaging charged particle beam microscope 750 as shown in FIG. 10c may allow for a further reduction of the distance over which a substrate is to travel along the x-direction 150 for the CD measurement on the substrate. Accordingly, the inner width 121 of the vacuum chamber 120 shown in FIG. 10c is smaller compared to a vacuum chamber including two imaging charged particle beam microscopes, such as e.g. vacuum chamber 120 shown in FIG. 10a.

FIG. 10d illustrates an embodiment according to which the apparatus 100 further includes a fourth imaging charged particle beam microscope 760. The first imaging charged particle beam microscope 130, the second imaging charged particle beam microscope 140, the third imaging charged particle beam microscope 750 and the fourth imaging charged particle beam microscope 760 are symmetrically arranged as an array shaped as a square. Therein, the first imaging charged particle beam microscope 130 and the second imaging charged particle beam microscope 140 are arranged as a first row of the array at a first y-coordinate 741. The third imaging charged particle beam microscope 750 and the fourth imaging charged particle beam microscope 760 are arranged as a second row of the array at a second y-coordinate 740. The third imaging charged particle beam microscope 750 is distanced from the first imaging charged particle beam microscope 130 along the y-direction 152 by a distance 781 and is distanced from the fourth imaging charged particle beam microscope 760 along the x-direction by a distance 782. The fourth imaging charged particle beam microscope 760 is further distanced from the second imaging charged particle beam microscope 140 by a distance 783 along the y-direction. The distance 135, the distance 781, the distance 782 and the distance 783 are equal distances. Compared to an apparatus having two imaging charged particle beam microscopes, an arrangement of four imaging charged particle beam microscopes as shown in FIG. 10d may allow for a reduction of the distance over which a substrate is to travel along the y-direction 152 for CD measurement on the substrate. Accordingly, a dimension 770 of the vacuum chamber 120 along the y-direction may be reduced compared to a vacuum chamber including two imaging charged particle beam microscopes, such as e.g. vacuum chamber 120 shown in FIG. 10a.

While the foregoing is directed to some embodiments, other and further embodiments may be devised without departing from the basic scope thereof, and the scope thereof is determined by the claims that follow.

The invention claimed is:

1. A method for automated critical dimension measurement on a substrate for display manufacturing, comprising:
   scanning a first field of view having a first size with a charged particle beam to obtain a first image having a first resolution of a first portion of the substrate for display manufacturing, the substrate being a large area substrate;
   determining a pattern and a first position of the pattern within the first image, wherein the first position is determined by pattern recognition techniques based on a structure of the pattern;
   scanning a second field of view with the charged particle beam to obtain a second image of a second portion of the substrate, the second field of view has a second size smaller than the first size and has a second position different than the first position, the second image has a second resolution higher than the first resolution;
   determining a critical dimension of a first structure provided on the substrate from the second image wherein the second image is provided at a first orientation, the first orientation determined to have a length expanding along the critical dimension of the first structure and a width corresponding to a number of scan lines to be measured;
   scanning a third field of view with the charged particle beam to obtain a third image of a third portion of the substrate, the third field of view has a third size smaller than the first size and has a third position provided relative to the first position, the third image has a third resolution higher than the first resolution; and
   determining a further critical dimension of a second structure provided on the substrate from the third image, the critical dimension of the second structure in the third image being determined at a second orientation different than the first orientation;
   the second image being within the first image.

2. The method of claim 1, wherein the critical dimension is a distance on the substrate.

3. The method of claim 2, further comprising:
   visualizing the distance in the first image.

4. The method of claim 1, wherein the second resolution and the third resolution are similar.

5. The method of claim 1, wherein the third field of view is different from the second field of view and/or wherein the third position is different from the second position.

6. The method of claim 1, wherein the first position is determined by a plurality of features of the pattern.

7. The method of claim 1, wherein the critical dimension is measured by an intensity signal of signal electrons.

8. The method of any of claim 1, wherein the first field of view is measured with a digital scanner.

9. The method of claim 1, wherein the first field of view has a minimum dimension of 50 µm or above and the second field of view has a maximum dimension of 35 µm or below.

10. The method of claim 1, wherein ratio between the first resolution and the second resolution is from 2:1 to 20:1.

11. The method of claim 1, further comprising:
repeating the automated critical dimension measurement on at least 5 areas of the substrate, the areas being distributed over at least 1.2 m$^2$.

12. An apparatus for inspecting a large area substrate for display manufacturing, the apparatus comprising:
a vacuum chamber;
a substrate support arranged in the vacuum chamber, wherein the substrate support provides a substrate receiving area of at least 1.2 m$^2$ and having a first receiving area dimension along a first direction;
a first imaging charged particle beam microscope and a second imaging charged particle beam microscope having a distance along the first direction of 30% to 70% of the first receiving area dimension; and
a controller comprising: a processor and a memory storing instructions that, when executed by the processor, cause the apparatus to perform a method according to claim 1.

13. The apparatus according to claim 12, wherein the vacuum chamber has a first inner dimension along the first direction of 150% to 180% of the first receiving area dimension along the first direction.

14. The apparatus of claim 12, wherein the second imaging charged particle beam microscope is distant from the first imaging charged particle beam microscope by a distance of at least 30 cm along the first direction.

15. A method of operating the apparatus according to claim 12, comprising:
matching a first coordinate system on the large area substrate of the first imaging charged particle beam microscope with a second coordinate system on the large area substrate of the second imaging charged particle beam microscope.

16. The method according to claim 1, wherein the pattern includes one or more features selected from the group consisting of via, lines, trenches, connections, material boundaries, and etched layer structures.

17. A method of inspecting a large area substrate for display manufacturing, comprising:
(a) imaging a first portion of the substrate in a first area having a first type of structure and a second type of structure to obtain a first image;
(b) determining a pattern and a first position of the pattern within the first portion, wherein the first position is determined by pattern recognition techniques based on a structure of the pattern;
(c) imaging a second portion of the substrate in the first area to obtain a second image at a second position different than the first position, the second image having a higher resolution than the first image, wherein the second image is provided at a first orientation, the first orientation determined to have a length expanding along the critical dimension of the first type of structure and a width corresponding to a number of scan lines to be measured;
imaging a third portion of the substrate in the first area to obtain a third image at a second position different than the first and second position, the third image having a higher resolution than the first image, wherein the third image is provided at a second orientation, the second orientation determined to have a length expanding along the critical dimension of the second type of structure and a width corresponding to a number of scan lines to be measured;
(d) determining a critical dimension of the first type of structure in the first area at the second position;
determining a critical dimension of the second type of structure in the second area at the third position; and
repeating (a) to (c) in a plurality of areas on the large area substrate, the plurality of areas being distributed over at least 1.2 m$^2$ on the large area substrate.

18. The method of claim 17, further comprising:
calculating a static of the critical dimension of the first type of structure with respect to the plurality of areas.

* * * * *